US007928801B1

(12) United States Patent
Lam et al.

(10) Patent No.: US 7,928,801 B1
(45) Date of Patent: Apr. 19, 2011

(54) SYSTEMS AND METHODS OF AMPLIFICATION BASED ON ARRAY PROCESSED INTERMODULATION SUPPRESSION

(75) Inventors: Lawrence K. Lam, San Jose, CA (US); Albert Ngo, San Jose, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 43 days.

(21) Appl. No.: 12/436,744

(22) Filed: May 6, 2009

(51) Int. Cl.
*H03F 3/68* (2006.01)
(52) U.S. Cl. .................................. 330/124 R; 330/149
(58) Field of Classification Search ............... 330/124 R, 330/149
See application file for complete search history.

(56) References Cited

U.S. PATENT DOCUMENTS

| 5,886,573 | A  | * | 3/1999  | Kolanek ........................... 330/10 |
| 5,966,048 | A  | * | 10/1999 | Thompson ................. 330/124 R |
| 6,515,544 | B1 | * | 2/2003  | Suzuki et al. ................. 330/151 |
| 6,700,444 | B2 |   | 3/2004  | Pengelly |
| 6,701,141 | B2 |   | 3/2004  | Lam |
| 6,737,914 | B2 | * | 5/2004  | Gu .................................... 330/2 |
| 7,009,560 | B1 |   | 3/2006  | Lam et al. |
| 7,315,207 | B2 |   | 1/2008  | Shiikuma |
| 7,427,895 | B1 |   | 9/2008  | Okubo et al. |
| 7,466,287 | B1 |   | 12/2008 | Lam et al. |

OTHER PUBLICATIONS

Takenaka, et al., "Improvement Of Intermodulation Distortion Asymmetry Characteristics With Wideband Microwave Signals in High Power Amplifiers", IEEE Transactions On Microwave Theory and Techniques, Jun. 2008, pp. 1355-1363, vol. 56, No. 6.

* cited by examiner

*Primary Examiner* — Robert Pascal
*Assistant Examiner* — Khiem D Nguyen
(74) *Attorney, Agent, or Firm* — McDermott Will & Emery LLP

(57) ABSTRACT

Systems and methods for achieving linear amplification with high efficiency are provided. An input signal is amplified using a plurality of amplifiers by dividing the input signal into a plurality of inputs signals, amplifying the plurality of input signals with the plurality of amplifiers and combining the amplified output signals of the plurality of amplifiers into a single amplified output signal. Coefficients are applied to the input signals and the amplified output signals of the amplifiers so that non-linear products due to the amplifiers are suppressed when the amplified output signals of the amplifiers are combined into the single amplified output signal. The suppression of the non-linear products allows an amplification system to achieve linear amplification using high efficiency non-linear amplifiers. The systems and methods can also be applied to other non-linear devices, for example, mixers and modulators, to suppress non-linear products in these devices.

19 Claims, 14 Drawing Sheets

N = total number of amplifying channels   c_k(N) is associated with the kth order non-linear coef a_k

| k | N=1 | N=2 | N=3 | N=4 | N=5 | N=6 | N=7 | N=8 | N=9 | N=10 | N=11 | N=12 | N=13 | N=14 | N=15 | N=16 |
|---|---|---|---|---|---|---|---|---|---|---|---|---|---|---|---|---|
| k=1 | 1 | 2.00 | 3.00 | 4.00 | 5.00 | 6.00 | 7.00 | 8.00 | 9.00 | 10.00 | 11.00 | 12.00 | 13.00 | 14.00 | 15.00 | 16.00 |
| k=2 | 1 | 1.41 | 2.00 | 2.61 | 3.24 | 3.86 | 4.49 | 5.13 | 5.76 | 6.39 | 7.03 | 7.66 | 8.30 | 8.93 | 9.57 | 10.20 |
| k=3 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k=4 | 1 | 1.41 | 1.00 | 1.08 | 1.24 | 1.41 | 1.60 | 1.80 | 2.00 | 2.20 | 2.41 | 2.61 | 2.82 | 3.03 | 3.24 | 3.44 |
| k=5 | 1 | 2.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k=6 | 1 | 1.41 | 2.00 | 1.08 | 1.00 | 1.04 | 1.11 | 1.20 | 1.31 | 1.41 | 1.53 | 1.64 | 1.76 | 1.88 | 2.00 | 2.12 |
| k=7 | 1 | 0.00 | 3.00 | 0.00 | 0.00 | 0.00 | 0.00 | 0.00 | 0.00 | 0.00 | 0.00 | 0.00 | 0.00 | 0.00 | 0.00 | 0.00 |
| k=8 | 1 | 1.41 | 2.00 | 2.61 | 1.24 | 1.04 | 1.00 | 1.02 | 1.06 | 1.12 | 1.19 | 1.26 | 1.34 | 1.41 | 1.49 | 1.58 |
| k=9 | 1 | 0.00 | 0.00 | 4.00 | 0.00 | 0.00 | 0.00 | 0.00 | 0.00 | 0.00 | 0.00 | 0.00 | 0.00 | 0.00 | 0.00 | 0.00 |
| k=10 | 1 | 1.41 | 1.00 | 2.61 | 3.24 | 1.41 | 1.11 | 1.02 | 1.00 | 1.01 | 1.04 | 1.08 | 1.13 | 1.18 | 1.24 | 1.29 |
| k=11 | 1 | 0.00 | 0.00 | 0.00 | 5.00 | 0.00 | 0.00 | 0.00 | 0.00 | 0.00 | 0.00 | 0.00 | 0.00 | 0.00 | 0.00 | 0.00 |
| k=12 | 1 | 1.41 | 2.00 | 1.08 | 3.24 | 3.86 | 1.60 | 1.20 | 1.06 | 1.01 | 1.00 | 1.01 | 1.03 | 1.06 | 1.09 | 1.13 |
| k=13 | 1 | 0.00 | 0.00 | 0.00 | 0.00 | 6.00 | 0.00 | 0.00 | 0.00 | 0.00 | 0.00 | 0.00 | 0.00 | 0.00 | 0.00 | 0.00 |
| k=14 | 1 | 1.41 | 2.00 | 1.08 | 1.24 | 3.86 | 4.49 | 1.80 | 1.31 | 1.12 | 1.04 | 1.01 | 1.00 | 1.01 | 1.02 | 1.04 |
| k=15 | 1 | 0.00 | 0.00 | 0.00 | 0.00 | 0.00 | 7.00 | 0.00 | 0.00 | 0.00 | 0.00 | 0.00 | 0.00 | 0.00 | 0.00 | 0.00 |
| k=16 | 1 | 1.41 | 1.00 | 2.61 | 1.24 | 1.41 | 4.49 | 5.13 | 2.00 | 1.41 | 1.19 | 1.08 | 1.03 | 1.01 | 1.00 | 1.00 |
| k=17 | 1 | 2.00 | 0.00 | 4.00 | 0.00 | 0.00 | 0.00 | 8.00 | 0.00 | 0.00 | 0.00 | 0.00 | 0.00 | 0.00 | 0.00 | 0.00 |
| k=18 | 1 | 1.41 | 2.00 | 2.61 | 3.24 | 1.04 | 1.60 | 5.13 | 5.76 | 2.20 | 1.53 | 1.26 | 1.13 | 1.06 | 1.02 | 1.00 |
| k=19 | 1 | 0.00 | 3.00 | 0.00 | 0.00 | 0.00 | 0.00 | 0.00 | 9.00 | 0.00 | 0.00 | 0.00 | 0.00 | 0.00 | 0.00 | 0.00 |
| k=20 | 1 | 1.41 | 2.00 | 1.08 | 3.24 | 1.04 | 1.11 | 1.80 | 5.76 | 6.39 | 2.41 | 1.64 | 1.34 | 1.18 | 1.09 | 1.04 |
| k=21 | 1 | 2.00 | 0.00 | 0.00 | 5.00 | 0.00 | 1.00 | 0.00 | 0.00 | 10.00 | 0.00 | 0.00 | 0.00 | 0.00 | 0.00 | 0.00 |
| k=22 | 1 | 1.41 | 2.00 | 1.08 | 3.24 | 1.41 | 1.00 | 1.20 | 2.00 | 6.39 | 7.03 | 2.61 | 1.76 | 1.41 | 1.24 | 1.13 |
| k=23 | 1 | 0.00 | 0.00 | 0.00 | 0.00 | 0.00 | 0.00 | 0.00 | 0.00 | 0.00 | 11.00 | 0.00 | 0.00 | 0.00 | 0.00 | 0.00 |
| k=24 | 1 | 1.41 | 2.00 | 2.61 | 1.24 | 3.86 | 1.11 | 1.02 | 1.31 | 2.20 | 7.03 | 7.66 | 2.82 | 1.88 | 1.49 | 1.29 |
| k=25 | 1 | 2.00 | 3.00 | 4.00 | 0.00 | 6.00 | 0.00 | 0.00 | 0.00 | 0.00 | 0.00 | 12.00 | 0.00 | 0.00 | 0.00 | 0.00 |

FIG. 3

N = total number of amplifying channels  c_k(N) is associated with the kth order non-linear coef a_k

| | N = 1 | N = 2 | N = 3 | N = 4 | N = 5 | N = 6 | N = 7 | N = 8 | N = 9 | N = 10 | N = 11 | N = 12 | N = 13 | N = 14 | N = 15 | N = 16 |
|---|---|---|---|---|---|---|---|---|---|---|---|---|---|---|---|---|
| k = 1 | 1 | 2.00 | 3.00 | 4.00 | 5.00 | 6.00 | 7.00 | 8.00 | 9.00 | 10.00 | 11.00 | 12.00 | 13.00 | 14.00 | 15.00 | 16.00 |
| k = 2 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 3 | 1 | 2.00 | 3.00 | 4.00 | 5.00 | 6.00 | 7.00 | 8.00 | 9.00 | 10.00 | 11.00 | 12.00 | 13.00 | 14.00 | 15.00 | 0.00 |
| k = 4 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 5 | 1 | 2.00 | 3.00 | 4.00 | 5.00 | 6.00 | 7.00 | 8.00 | 9.00 | 10.00 | 11.00 | 12.00 | 13.00 | 14.00 | 0.00 | 0.00 |
| k = 6 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 7 | 1 | 2.00 | 3.00 | 4.00 | 5.00 | 6.00 | 7.00 | 8.00 | 9.00 | 10.00 | 11.00 | 12.00 | 13.00 | 0.00 | 0.00 | 0.00 |
| k = 8 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 9 | 1 | 2.00 | 3.00 | 4.00 | 5.00 | 6.00 | 7.00 | 8.00 | 9.00 | 10.00 | 11.00 | 12.00 | 0.00 | 0.00 | 0.00 | 0.00 |
| k = 10 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 11 | 1 | 2.00 | 3.00 | 4.00 | 5.00 | 6.00 | 7.00 | 8.00 | 9.00 | 10.00 | 11.00 | 0.00 | 0.00 | 0.00 | 0.00 | 0.00 |
| k = 12 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 13 | 1 | 2.00 | 3.00 | 4.00 | 5.00 | 6.00 | 7.00 | 8.00 | 9.00 | 10.00 | 0.00 | 0.00 | 0.00 | 0.00 | 0.00 | 0.00 |
| k = 14 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 15 | 1 | 2.00 | 3.00 | 4.00 | 5.00 | 6.00 | 7.00 | 8.00 | 9.00 | 0.00 | 0.00 | 0.00 | 0.00 | 0.00 | 0.00 | 0.00 |
| k = 16 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 16.00 |
| k = 17 | 1 | 2.00 | 3.00 | 4.00 | 5.00 | 6.00 | 7.00 | 8.00 | 0.00 | 0.00 | 0.00 | 0.00 | 0.00 | 0.00 | 0.00 | 0.00 |
| k = 18 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 19 | 1 | 2.00 | 3.00 | 4.00 | 5.00 | 6.00 | 7.00 | 0.00 | 0.00 | 0.00 | 0.00 | 0.00 | 0.00 | 0.00 | 0.00 | 0.00 |
| k = 20 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 21 | 1 | 2.00 | 3.00 | 4.00 | 5.00 | 6.00 | 0.00 | 0.00 | 0.00 | 0.00 | 0.00 | 0.00 | 0.00 | 0.00 | 0.00 | 0.00 |
| k = 22 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 23 | 1 | 2.00 | 3.00 | 4.00 | 5.00 | 0.00 | 0.00 | 0.00 | 0.00 | 0.00 | 0.00 | 0.00 | 0.00 | 0.00 | 0.00 | 0.00 |
| k = 24 | 1 | 0.00 | 0.00 | 0.00 | 0.00 | 0.00 | 0.00 | 0.00 | 0.00 | 0.00 | 0.00 | 0.00 | 0.00 | 0.00 | 0.00 | 0.00 |
| k = 25 | 1 | 2.00 | 3.00 | 4.00 | 0.00 | 6.00 | 0.00 | 8.00 | 0.00 | 10.00 | 0.00 | 12.00 | 0.00 | 0.00 | 0.00 | 0.00 |

FIG. 11

SYSTEMS AND METHODS OF AMPLIFICATION BASED ON ARRAY PROCESSED INTERMODULATION SUPPRESSION

FIELD OF THE INVENTION

The present invention generally relates to signal amplification and, more particularly, to systems and methods for signal amplification based on array processed intermodulation suppression.

BACKGROUND OF THE INVENTION

In satellite communications, a plurality of signals modulated on multiple carriers that span a given frequency band are combined and applied to a last stage power amplifier. The composite multi-carrier signal has a large variation in amplitude, which is characterized by a large peak-to-average power ratio.

A challenge for power amplifiers is providing the required RF power or amplification with high linearity and efficiency. Linearity can be measured by the ratio of the desired signal and all undesired intermodulation products at the output of the amplifier. Efficiency can be measured by the ratio of the RF signal power delivered at the output of the amplifier and the total DC power required by the amplifier. Linearity and efficiency tend to move in opposite directions in practical amplifiers. Highly linear amplifiers such as Class A amplifiers have lower efficiencies than non-linear amplifiers. Non-linear amplifiers such as Class C amplifiers have higher efficiencies but may produce unacceptable levels of in-band and adjacent-band intermodulation products.

Accordingly, it is desirable to suppress the non-linear intermodulation products of non-linear amplifiers to provide linear and efficient amplifiers.

SUMMARY OF THE INVENTION

Systems and methods for achieving linear amplification with high efficiency are provided. An input signal is amplified using a plurality of amplifiers by dividing the input signal into a plurality of inputs signals, amplifying the plurality of input signals with the plurality of amplifiers and combining the amplified output signals of the plurality of amplifiers into a single amplified output signal. Coefficients are applied to the input signals and the amplified output signals of the amplifiers so that non-linear products due to the amplifiers are suppressed when the amplified output signals of the amplifiers are combined into the single amplified output signal. The suppression of the non-linear products allows an amplification system to achieve linear amplification using high efficiency non-linear amplifiers. The systems and methods can also be applied to other non-linear devices, for example, mixers and modulators, to suppress non-linear products in these devices.

In an aspect of the disclosure, an amplification system comprises a plurality of amplifiers, wherein each of the amplifiers is configured to amplify a respective input signal into a respective amplified output signal, and a plurality of coefficient units configured to apply coefficients to the input signals and the amplified output signals of the plurality of amplifiers. The amplification system further comprises a signal combiner configured to combine the amplified output signals into a single amplified output signal, wherein the applied coefficients suppress non-linear products when the amplified output signals are combined into the single amplified output signal.

Examples of values for the coefficients are provided according to aspects of the disclosure for suppressing non-linear products from the single amplified output signal. Sets of coefficients for suppressing odd order non-linear products and even order non-linear products are provided according to aspects of the disclosure.

In another aspect, the plurality of coefficient units comprises a plurality of phase and amplitude adjusters configured to apply phase and amplitude adjustments to the input signals of the plurality of amplifiers to compensate for differences among the plurality of amplifiers in addition to suppressing non-linear products.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing summary of the invention and the following detailed description are exemplary and explanatory and are intended to provide further explanation of the invention as claimed.

BRIEF DESCRIPTION OF THE DRAWINGS

FIG. 3 is a table providing a set of coefficients for suppressing non-linear products according to an aspect of the disclosure.

FIG. 11 is a table providing a set of coefficients for suppressing non-linear products according to another aspect of the disclosure.

Figure 1:
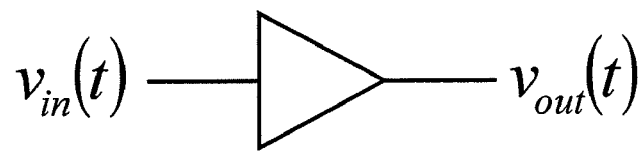
FIG. 1 is a diagram of a power amplifier according to an aspect of the disclosure.

The accompanying drawings, which are included to provide further understanding of the invention and are incorporated in and constitute a part of this specification, illustrate aspects of the invention and together with the description serve to explain the principles of the invention.

DETAILED DESCRIPTION OF THE INVENTION

In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail to avoid obscuring concepts of the present invention.

Reference will now be made in detail to aspects of the subject technology, examples of which are illustrated in the accompanying drawings, wherein like reference numerals refer to like elements throughout.

FIG. 1 is a diagram of a power amplifier 110, which receives input signal $v_{in}(t)$ and outputs amplified signal $v_{out}(t)$. For a linear amplifier, the amplified signal $v_{out}(t)$ is linearly proportional to the input signal $v_{in}(t)$ by the amplification of the amplifier. The transfer function of a non-linear power amplifier may be approximated by:

$$v_{out}(t) = \sum_{k=1}^{K} a_k \{v_{in}(t)\}^k \quad (1)$$

where k is an index indicating the order of a product in the transfer function and $a_k$ is a coefficient for order k. The first order product (k=1) corresponds to the linear portion of the transfer function. Thus, the first-order coefficient $a_1$ denotes the linear amplification of the amplifier. The higher order coefficients denote undesirable higher order non-linear products (e.g., intermodulation products). Systems and methods for suppressing the higher order non-linear products according to aspects of the disclosure are described below.

Non-linear amplifiers such as Class C amplifiers tend to have higher efficiencies than linear amplifiers such as Class A amplifiers. Because higher efficiency amplifiers use less DC power and dissipate less heat, non-linear amplifiers can be used to achieve lower DC power consumption and lower heat dissipation. An example of this is illustrated in Table 1 below. Table 1 shows power added efficient (PAE), DC power, and heat dissipation for different classes of amplifiers where the required power at the amplifier output is one Watt.

TABLE 1

Comparing Different Classes of Amplifiers

| Amplifier Class | Assumed PAE | DC Power | Heat Dissipation |
|---|---|---|---|
| Class A | 35% | 2.85 W | 1.85 W |
| Class AB | 45% | 2.22 W | 1.22 W |

TABLE 1-continued

Comparing Different Classes of Amplifiers

| Amplifier Class | Assumed PAE | DC Power | Heat Dissipation |
|---|---|---|---|
| Class B | 55% | 1.82 W | 0.82 W |
| Class C | 65% | 1.54 W | 0.54 W |
| Class E | 85% | 1.17 W | 0.17 W |

As shown in Table 1, a change from the Class AB amplifier to the Class C amplifier reduces DC power by 30% and reduces heat dissipation by a factor of greater than 2. A change from the Class AB amplifier to the Class E amplifier reduces DC power by 47% and reduces heat dissipation by a factor of greater than 7. Thus, non-linear amplifiers can be used to reduce DC power consumption and heat dissipation.

Figure 2:
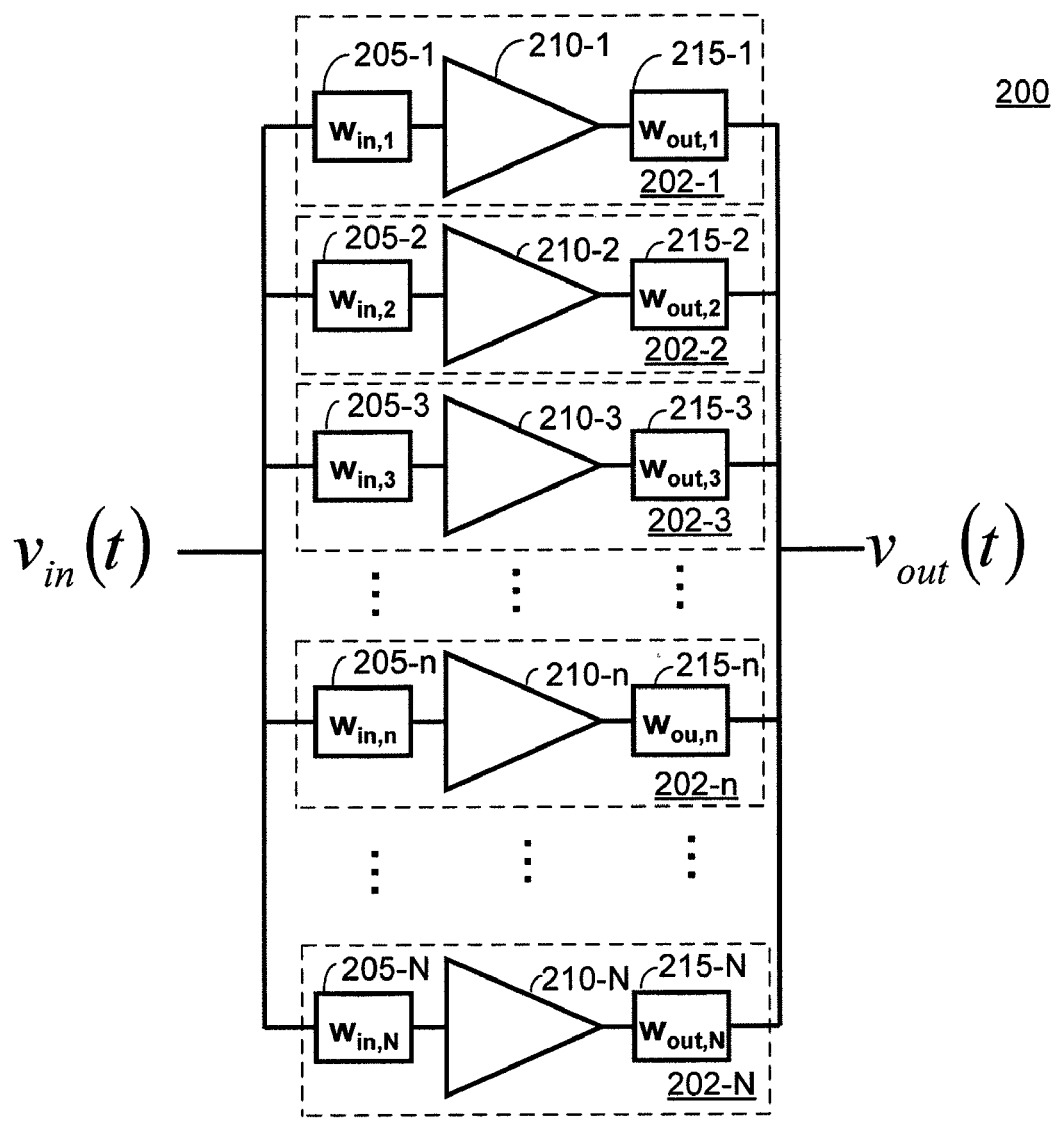
FIG. 2 is a diagram of an amplification system comprising N amplifying channels according to an aspect of the disclosure.

FIG. 2 is a diagram of an amplification system 200 according to an aspect of the disclosure. The amplifier system 200 comprises a plurality of N amplifiers 210-1 to 210-N. In one aspect, the amplifiers 210-1 to 210-N belong to the same amplifier class and have approximately the same operating characteristics. The amplifier system 200 also comprises a plurality of input coefficient units 205-1 to 205-N where each input coefficient unit 205-1 to 205-N is coupled to an input of one of the amplifiers 210-1 to 210-N. The amplifier system 200 further comprises a plurality of output coefficient units 215-1 to 215-N where each output coefficient unit 215-1 to 215-N is coupled to an output of one of the amplifiers 210-1 to 210-N. The amplifier system 200 is divided into N amplifying channels 202-1 to 202-N where each amplifying channel 202-1 to 202-N comprises one of the amplifiers 210-1 to 210-N and respective input and output coefficient units 205-1 to 205-N and 215-1 to 215-N.

Each input coefficient unit 205-1 to 205-N applies an input coefficient $w_{in,n}$ to the respective input signal and each output coefficient unit 215-1 to 215-N applies an output coefficient $w_{out,n}$ to the respective amplifier output signal, where n is an amplifying channel index from 1 to N. As discussed further below, the plurality of input and output coefficient units 205-1 to 205-N and 215-1 to 215-N suppress non-linear products from the amplified output signal $v_{out}(t)$ of the amplification system 200.

During operation, the signal $v_{in}(t)$ to be amplified is inputted to the amplification system 200. The input signal $v_{in}(t)$ is divided into N signals, where each of the N signals is inputted to one of the amplifying channels 202-1 to 202-N. In each amplifying channel 202-1 to 202-N, the respective input coefficient unit 205-1 to 205-N applies the respective input coefficient $w_{in,n}$ to the respective input signal, the respective amplifier 210-1 to 210-N amplifies the respective input signal, and the respective output coefficient unit 215-1 to 215-N applies the respective output coefficient $w_{out,n}$ to the respective amplified output signal from the respective amplifier 210-1 to 210-N. The amplified output signals of the amplifying channels 202-1 to 202-N are then combined to produce the amplified output signal $v_{out}(t)$ of the amplification system 200. As discussed further below, the values of the input coefficients $w_{in,n}$ and the output coefficients $w_{out,n}$ are selected so that non-linear products (e.g., intermodulation products) due to the amplifiers 210-1 to 210-N are canceled out when the amplified output signals are combined into the amplified output signal $v_{out}(t)$, thereby suppressing the non-linear products. This allows the amplification system 200 to achieve linear amplification using high efficiency non-linear amplifiers.

Assuming that the amplifiers 205-1 to 205-N have identical transfer functions and operational characteristics, where the transfer function of each amplifier is given by Eq. (1), the amplified output signal $v_{out}(t)$ of the amplification system 200 may be given by:

$$v_{out}(t) = \sum_{n=1}^{N} w_{out,n} \sum_{k=1}^{K} a_k \{w_{in,n} v_{in}(t)\}^k \qquad (2)$$

Eq. (2) may be rewritten as follows:

$$v_{out}(t) = \sum_{k=1}^{K} \sum_{n=1}^{N} a_k w_{out,n} \{w_{in,n} v_{in}(t)\}^k \qquad (3)$$

In one aspect, the input coefficient $w_{in,n}$ for each amplifying channel 202-1 to 202-N is given by:

$$w_{in,n} = e^{j\alpha(n-1)\pi/N} \qquad (4)$$

where n is the channel index identifying the respective amplifying channel 202-1 to 202-N and a is a parameter. The output coefficient $w_{out,n}$ for each amplifying channel 202-1 to 202-N is given by:

$$w_{out,n} = e^{j\beta(N-n)\pi/N} \qquad (5)$$

where n is the channel index identifying the respective amplifying channel 202-1 to 202-N and β is a parameter. Exemplary values for the parameters α and β are given below according to aspects of the disclosure.

Plugging Eqs. (4) and (5) for $w_{in,n}$ and $w_{out,n}$, respectively, into Eq. (3) results in:

$$V_{out}(t) = \sum_{k=1}^{K} \sum_{n=1}^{N} a_k e^{j\beta(N-n)\pi/N} \{e^{j\alpha(n-1)\pi/N} v_{in}(t)\}^k \qquad (6)$$

Eq. (6) may be rewritten to isolate the transfer function of the amplifiers as follows:

$$v_{out}(t) = \sum_{k=1}^{K} a_k \{v_{in}(t)\}^k \sum_{n=1}^{N} e^{j(\beta N - \beta n + \alpha k(n-1))\pi/N} \qquad (7)$$

$$= \sum_{k=1}^{K} a_k \{v_{in}(t)\}^k \sum_{n=1}^{N} e^{j\beta\pi} e^{j(\alpha k n - \beta n - \alpha k)\pi/N}$$

Eq. (7) may be further rewritten as follows:

$$v_{out}(t) = \sum_{k=1}^{K} a_k \{v_{in}(t)\}^k c_k(N) \qquad (8)$$

where the coefficient $c_k(N)$ for each order k is given by:

$$c_k(N) = \sum_{n=1}^{N} e^{j\beta\pi} e^{j(\alpha k n - \beta n - \alpha k)\pi/N} \qquad (9)$$

Thus, each coefficient $a_k$ in the transfer function of the amplifiers is modified by a respective coefficient $c_k(N)$, which is a function of k and N (number of amplifying channels). When $c_k(N)$ for a particular order k is zero, the corresponding k order non-linear product in the transfer function is suppressed.

The amplifiers 210-1 to 210-N may be implemented using Class AB, E or F amplifiers, Doherty amplifiers or other types of amplifiers. In one aspect, the amplifiers 210-1 to 210-N all belong to the same amplifier class to ensure that their transfer functions and operating characteristics are approximately identical. The amplifiers 210-1 to 210-N may be integrated on the same integrated circuit to provide good matching of the characteristics of the amplifiers 210-1 to 210-N.

The input coefficient units 205-1 to 205-N and output coefficient units 215-1 to 215-N, may be implemented using phase shifters, transmission lines of different lengths, amplitude adjusters, a combination thereof, or any other devices. Other devices that can be used to implement the coefficient units include branch-line couplers, rat-race couplers, Butler matrix and other devices. For example, a phase shifter can be used to apply a coefficient of $w_{in,n} = e^{j\pi/2}$ to an input signal by shifting the phase of the input signal by 90°.

The input signal $v_{in}(t)$ may be divided into the N input signals for the amplifying channels 202-1 to 202-N using a signal divider. The input signal $v_{in}(t)$ may be divided in the RF domain, in the baseband domain and converted up, or in the software domain. The amplified output signals of the amplifying channels 202-1 to 202-N may be combined by a power combiner, for example, a Wilkinson power combiner.

In one aspect, the parameters α and β are both equal to one. In this aspect, the input and output coefficients $w_{in,n}$ and $w_{out,n}$, respectively, for a given amplifying channel n are as follows:

$$w_{in,n} = e^{j(n-1)\pi/N} \qquad (10)$$

$$w_{out,n} = e^{j(N-n)\pi/N} \qquad (11)$$

The coefficient $c_k(N)$ for a given order k is given by:

$$c_k(N) = \sum_{n=1}^{N} e^{j\pi} e^{j(kn-n-k)\pi/N} \qquad (12)$$

FIG. 3 is a table showing computed values of the coefficient $c_k(N)$ for different numbers of amplifying channels N and different orders k where α=β=1. The coefficients in this aspect are referred to as a first set of coefficients to distinguish them from coefficients in other aspects of the disclosure discussed below. For an example of two amplifying channels (N=2), the 3rd, 7th, 11th and higher order non-linear products are suppressed (i.e., $c_k(2)$ equals zero for these terms). For the example of six amplifying channels (N=6), all odd order non-linear products below the 13th order and other higher order non-linear terms are suppressed. Thus, the coefficients $c_k(N)$ according to this aspect can be used to suppress odd order non-linear products. Even order non-linear products are not suppressed in this aspect. However, for cases where the even order non-linear products are located outside the frequency band of interest, the even order non-linear products can be filtered out with a filter, as discussed further below.

Figure 4:
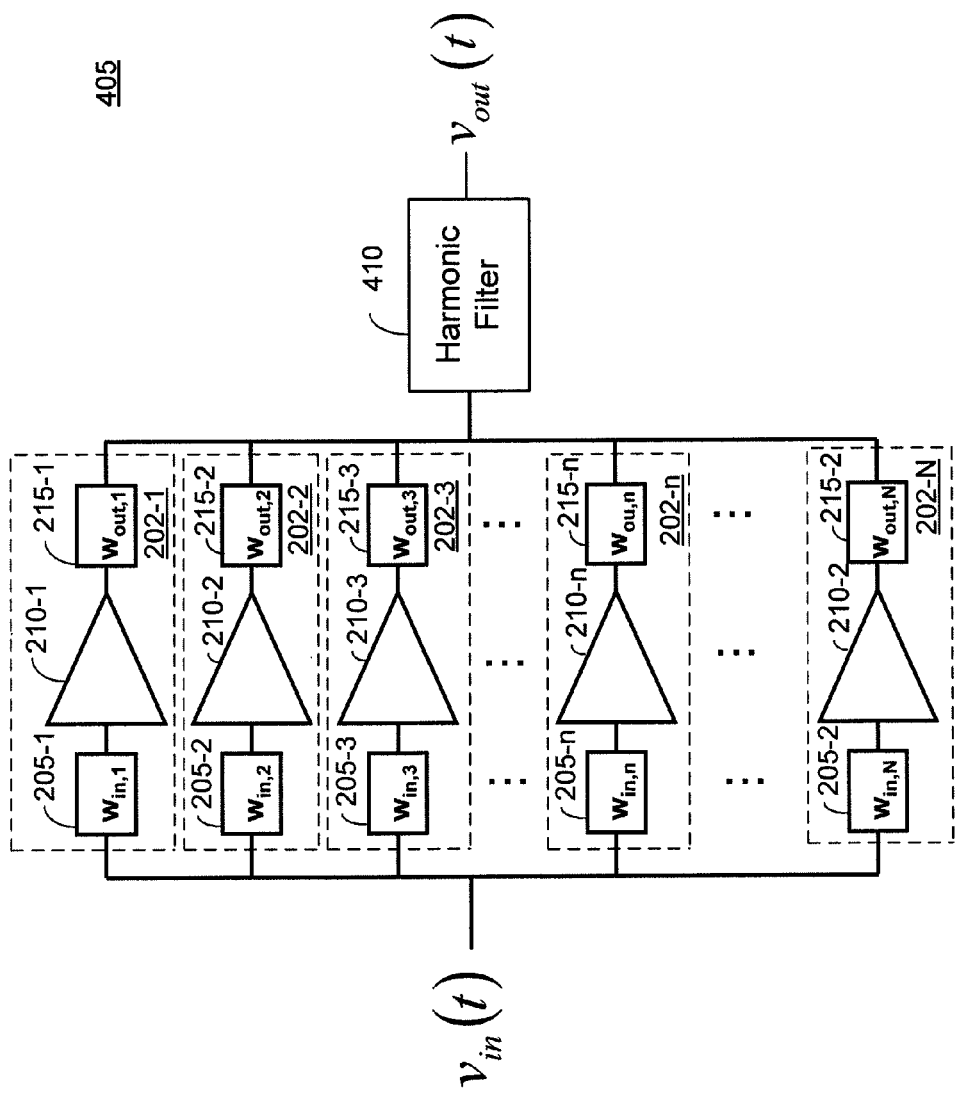
FIG. 4 is a diagram of an amplification system comprising N amplifying channels and a harmonic filter according to an aspect of the disclosure.

Suppression of odd order non-linear intermodulation products reduces in-band and adjacent-band intermodulation products. Odd order non-linear products in amplification causes spectral regrowth. The coefficients $c_k(N)$ according to the above aspect can be used to suppress the odd order non-linear products. Even order non-linear products are spectrally located away from the frequency band of the signal being amplified. Thus, the even order non-linear products can be filtered out of the amplified signal with a filter. FIG. 4 shows an example of an amplification system 405 including a harmonic filter 410 for filtering out even order non-linear products from the amplified signal. The harmonic filter 410 passes signals within the desired frequency band while filtering out out-of-band even order non-linear products.

Further, some amplifier configurations, including push-pull amplifier configurations, have relatively low even order non-linear intermodulation products. These amplifiers configurations can be used to further reduce even order non-linear intermodulation products.

Figure 5:
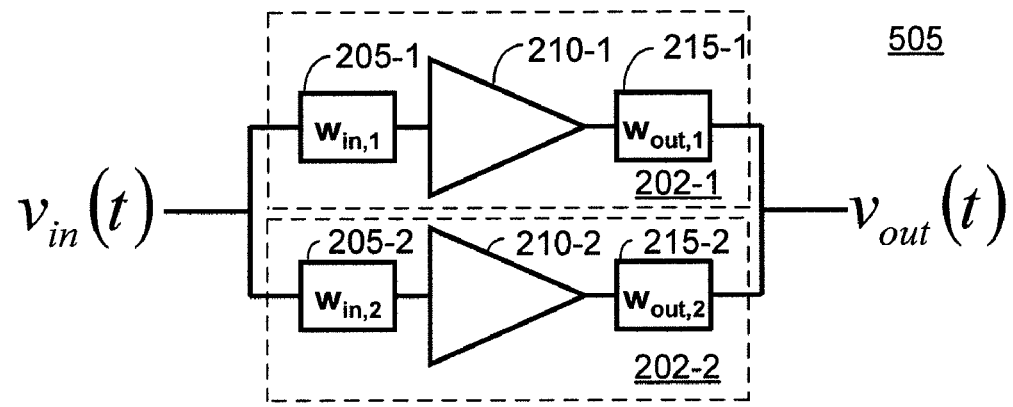
FIG. 5 is a diagram of an amplification system comprising two amplifying channels according to an aspect of the disclosure.

FIG. 5 shows an example of an amplification system 505 comprising two amplifying channels 202-1 and 202-2. The amplification system 505 in this example suppresses the 3rd order non-linear product and other higher order non-linear products where $\alpha=\beta=1$. The input and output coefficients for this amplification system 505 are shown in Table 2 below.

TABLE 2

| Channel | $W_{in,n}$ | $W_{out,n}$ |
|---|---|---|
| 1 | $W_{in,1} = 1$ | $W_{out,1} = e^{j\pi/2}$ |
| 2 | $W_{in,2} = e^{j\pi/2}$ | $W_{out,2} = 1$ |

Figure 6:
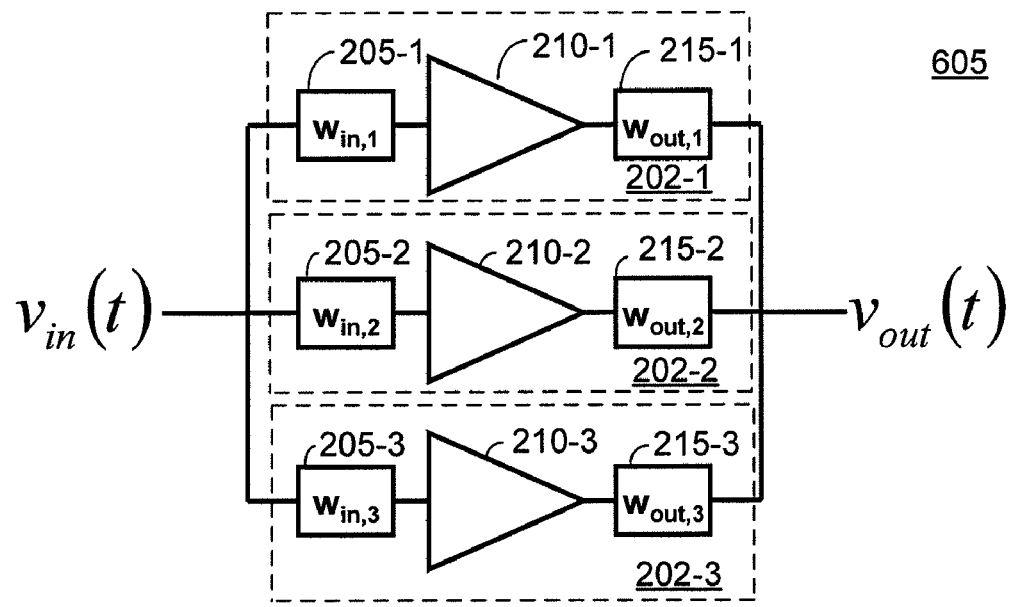
FIG. 6 is a diagram of an amplification system comprising three amplifying channels according to an aspect of the disclosure.

FIG. 6 shows an example of an amplification system 605 comprising three amplifying channels 202-1 to 202-3. The amplification system 605 in this example suppresses the 3rd and 5th order non-linear products and other higher order non-linear products where $\alpha=\beta=1$. The input and output coefficients for this amplification system 605 are shown in Table 3 below.

TABLE 3

| Channel | $W_{in,n}$ | $W_{out,n}$ |
|---|---|---|
| 1 | $W_{in,1} = 1$ | $W_{out,1} = e^{j2\pi/3}$ |
| 2 | $W_{in,2} = e^{j\pi/3}$ | $W_{out,2} = e^{j\pi/3}$ |
| 3 | $W_{in,3} = e^{j2\pi/3}$ | $W_{out,3} = 1$ |

Figure 7:
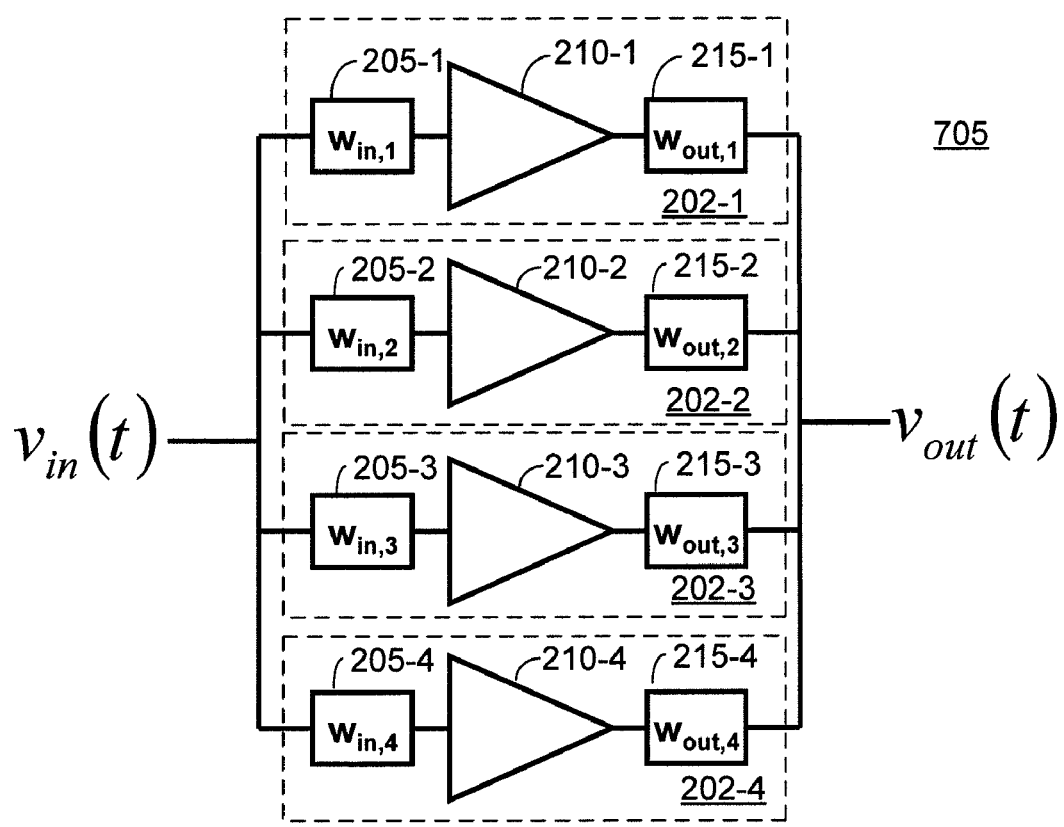
FIG. 7 is a diagram of an amplification system comprising four amplifying channels according to an aspect of the disclosure.

FIG. 7 shows an example of an amplification system 705 comprising four amplifying channels 202-1 to 202-4. The amplification system 705 in this example suppresses the 3rd, 5th and 7th order non-linear products and other higher order non-linear products where $\alpha=\beta=1$. The input and output coefficients for this amplification system 705 are shown in Table 4 below.

TABLE 4

| Channel | $W_{in,n}$ | $W_{out,n}$ |
|---|---|---|
| 1 | $W_{in,1} = 1$ | $W_{out,1} = e^{j3\pi/4}$ |
| 2 | $W_{in,2} = e^{j\pi/4}$ | $W_{out,2} = e^{j\pi/2}$ |
| 3 | $W_{in,3} = e^{j\pi/2}$ | $W_{out,3} = e^{j\pi/4}$ |
| 4 | $W_{in,4} = e^{j3\pi/4}$ | $W_{out,4} = 1$ |

Figure 8:
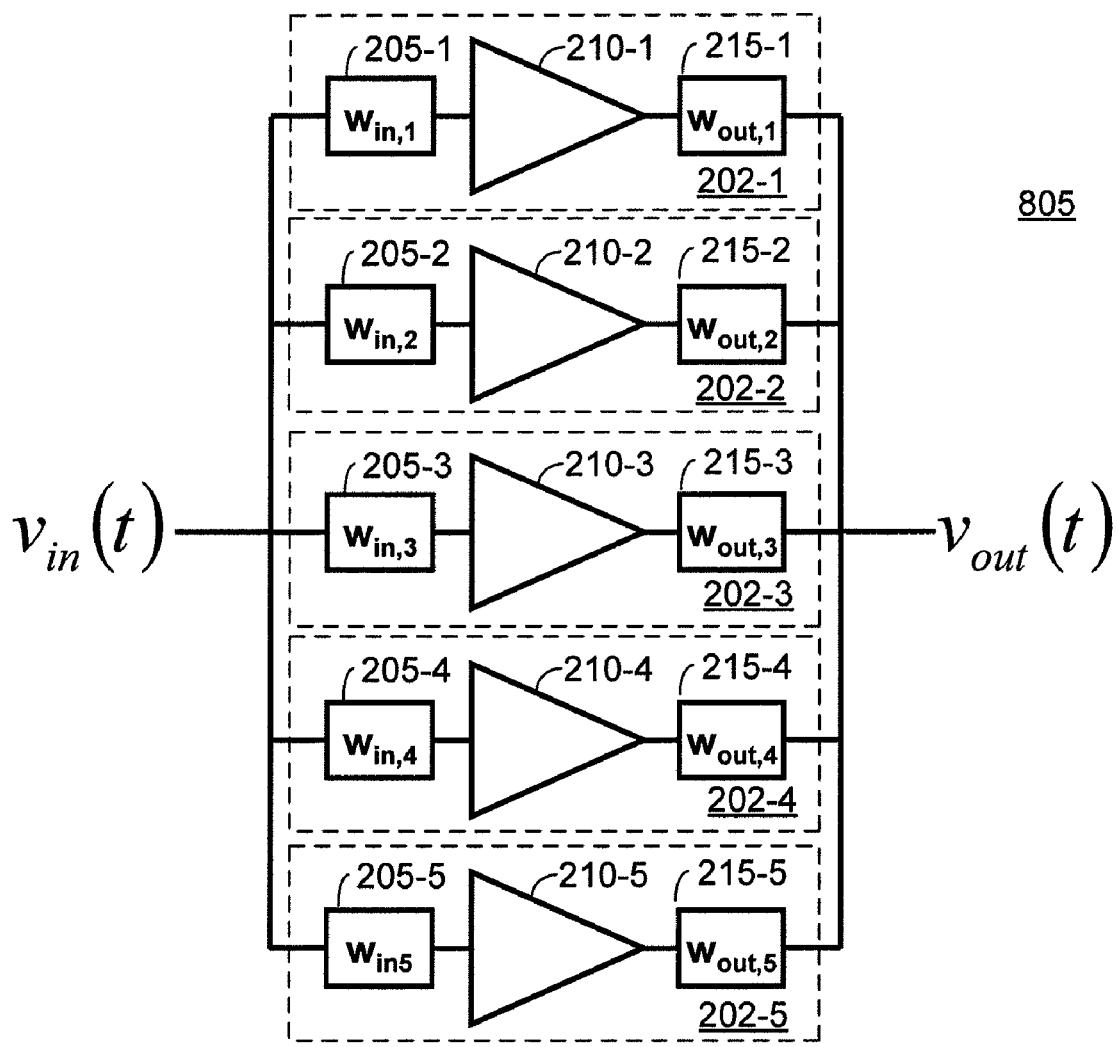
FIG. 8 is a diagram of an amplification system comprising five amplifying channels according to an aspect of the disclosure.

FIG. 8 shows an example of an amplification system 805 comprising five amplifying channels 202-1 to 202-5. The amplification system 805 in this example suppresses the 3rd, 5th, 7th and 9th order non-linear products and other higher order non-linear products where $\alpha=\beta=1$. The input and output coefficients for this amplification system 805 are shown in Table 5 below.

TABLE 5

| Channel | $W_{in,n}$ | $W_{out,n}$ |
|---|---|---|
| 1 | $W_{in,1} = 1$ | $W_{out,1} = e^{j4\pi/5}$ |
| 2 | $W_{in,2} = e^{j\pi/5}$ | $W_{out,2} = e^{j3\pi/5}$ |
| 3 | $W_{in,3} = e^{j2\pi/5}$ | $W_{out,3} = e^{j2\pi/5}$ |
| 4 | $W_{in,4} = e^{j3\pi/5}$ | $W_{out,4} = e^{j\pi/5}$ |
| 5 | $W_{in,5} = e^{j4\pi/5}$ | $W_{out,5} = 1$ |

Figure 9:
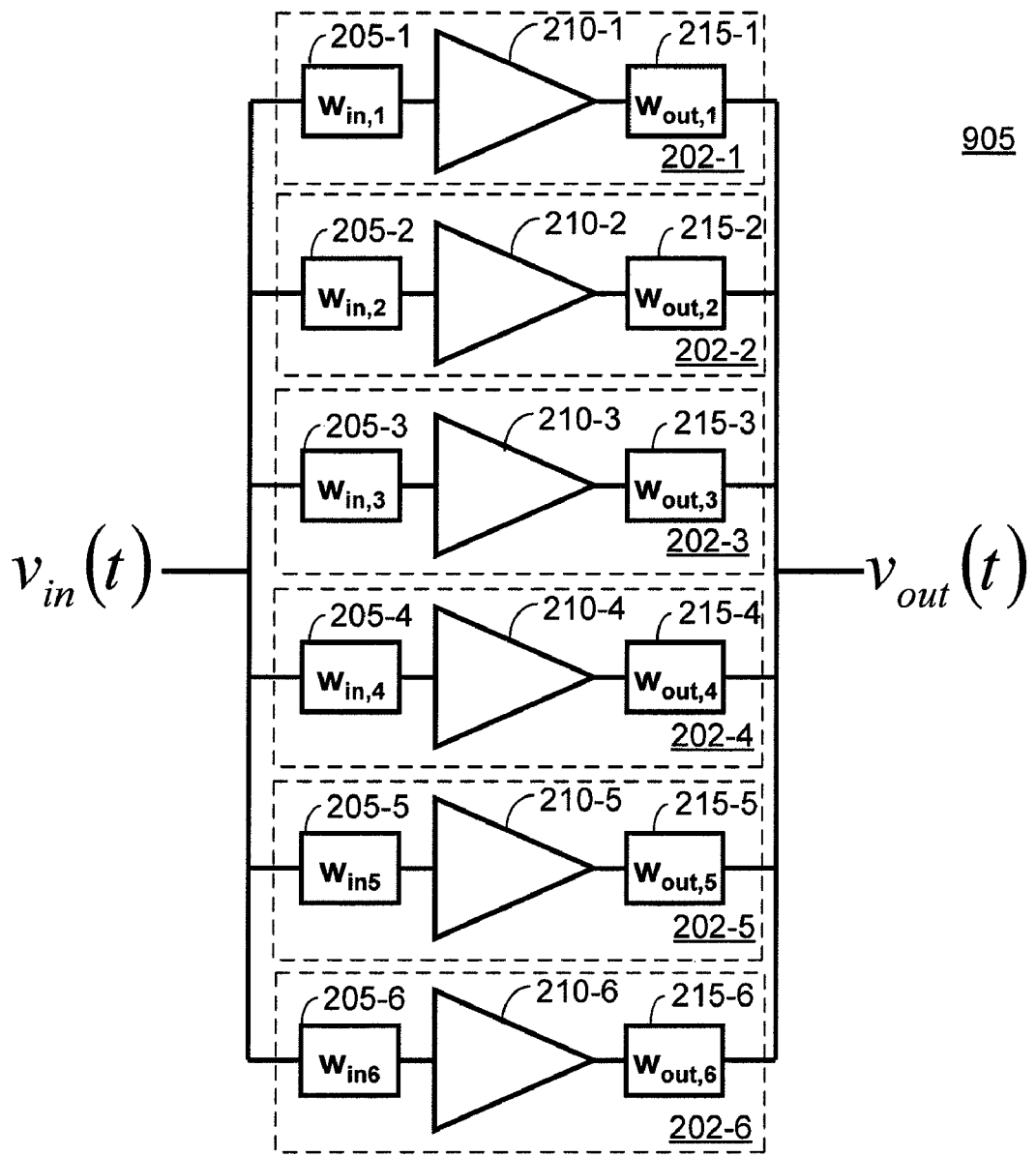
FIG. 9 is a diagram of an amplification system comprising six amplifying channels according to an aspect of the disclosure.

FIG. 9 shows an example of an amplification system 905 comprising six amplifying channels 202-1 to 202-6. The amplification system 905 in this example suppresses the 3rd, 5th, 7th, 9th and 11th order non-linear products and other higher order non-linear products where $\alpha=\beta=1$. The input and output coefficients for this amplification system 905 are shown in Table 6 below.

TABLE 6

| Channel | $W_{in,n}$ | $W_{out,n}$ |
|---|---|---|
| 1 | $W_{in,1} = 1$ | $W_{out,1} = e^{j5\pi/6}$ |
| 2 | $W_{in,2} = e^{j\pi/6}$ | $W_{out,2} = e^{j2\pi/3}$ |
| 3 | $W_{in,3} = e^{j\pi/3}$ | $W_{out,3} = e^{j\pi/2}$ |
| 4 | $W_{in,4} = e^{j\pi/2}$ | $W_{out,4} = e^{j\pi/3}$ |
| 5 | $W_{in,5} = e^{j2\pi/3}$ | $W_{out,5} = e^{j\pi/6}$ |
| 6 | $W_{in,6} = e^{j5\pi/6}$ | $W_{out,6} = 1$ |

Figure 10:
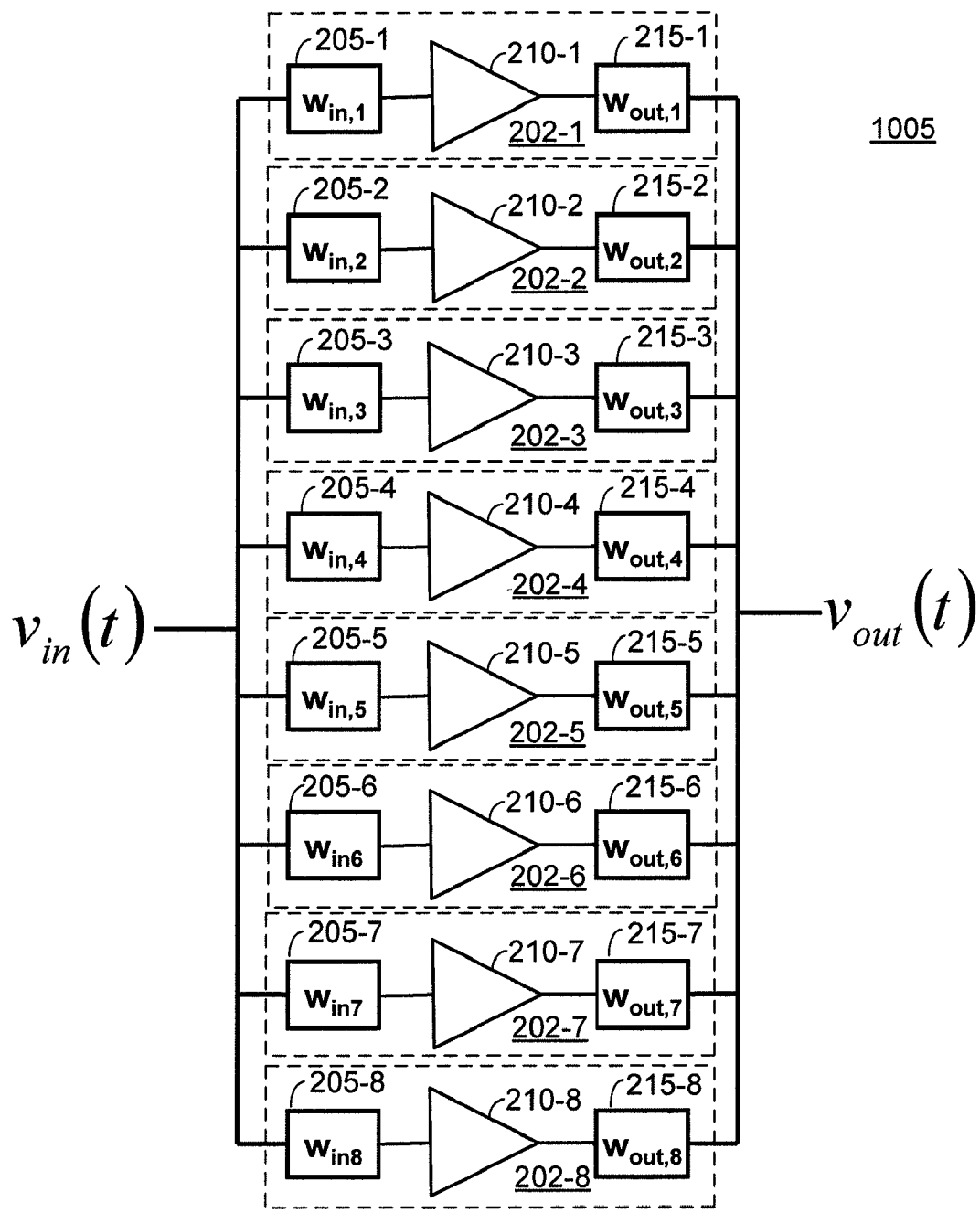
FIG. 10 is a diagram of an amplification system comprising eight amplifying channels according to an aspect of the disclosure.

FIG. 10 shows an example of an amplification system 1005 comprising eight amplifying channels 202-1 to 202-8. The amplification system 1005 in this example suppresses the 3rd, 5th, 7th, 9th, 11th and 13th order non-linear products and other higher order non-linear products where $\alpha=\beta=1$. The input and output coefficients for this amplification system 1005 are shown in Table 7 below.

TABLE 7

| Channel | $W_{in,n}$ | $W_{out,n}$ |
|---|---|---|
| 1 | $W_{in,1} = 1$ | $W_{out,1} = e^{j7\pi/8}$ |
| 2 | $W_{in,2} = e^{j\pi/8}$ | $W_{out,2} = e^{j3\pi/4}$ |
| 3 | $W_{in,3} = e^{j\pi/4}$ | $W_{out,3} = e^{j5\pi/8}$ |
| 4 | $W_{in,4} = e^{j3\pi/8}$ | $W_{out,4} = e^{j\pi/2}$ |
| 5 | $W_{in,5} = e^{j\pi/2}$ | $W_{out,5} = e^{j3\pi/8}$ |
| 6 | $W_{in,6} = e^{j5\pi/8}$ | $W_{out,6} = e^{j\pi/4}$ |
| 7 | $W_{in,7} = e^{j3\pi/4}$ | $W_{out,7} = e^{j\pi/8}$ |
| 8 | $W_{in,8} = e^{j7\pi/8}$ | $W_{out,8} = 1$ |

In another aspect, the parameters $\alpha$ and $\beta$ are both equal to two. In this aspect, the input and output coefficients $w_{in,n}$ and $w_{out,n}$, respectively, for a given amplifying channel n are as follows:

$$w_{in,n} = e^{j2(n-1)\pi/N} \qquad (13)$$

$$w_{out,n} = e^{j2(N-n)\pi/N} \qquad (14)$$

The coefficient $c_k(N)$ for a given order k is given by:

$$c_k(N) = \sum_{n=1}^{N} e^{j2\pi} e^{j2(kn-n-k)\pi/N} \quad (15)$$

FIG. 11 is a table showing computed values of the coefficients $c_k(N)$ for different numbers of amplifying channels N and different orders k where $\alpha=\beta=2$. The coefficients in this aspect are referred to as a second set of coefficients to distinguish them from coefficients in FIG. 3. For an example of two amplifying channels (N=2), all even order non-linear products are suppressed (i.e., $c_k(2)$ equals zero for all even order non-linear products). The second set of coefficients $c_k(N)$ provide suppression of more of the higher order non-linear products relative to the first set of coefficients. However, the second set of coefficients do not suppress odd order non-linear products as quickly. The parameters $\alpha$ and $\beta$ may have other values besides one and two depending on the particular application. Also, the parameters $\alpha$ and $\beta$ may have different values from each other.

Table 8 shows the input and output coefficients for the amplification system 505 in FIG. 5 where $\alpha=\beta=2$.

TABLE 8

| Channel | $W_{in,n}$ | $W_{out,n}$ |
|---|---|---|
| 1 | $W_{in,1} = 1$ | $W_{out,1} = e^{j\pi}$ |
| 2 | $W_{in,2} = e^{j\pi}$ | $W_{out,2} = 1$ |

Table 9 shows the input and output coefficients for the amplification system 605 in FIG. 6 where $\alpha=\beta=2$.

TABLE 9

| Channel | $W_{in,n}$ | $W_{out,n}$ |
|---|---|---|
| 1 | $W_{in,1} = 1$ | $W_{out,1} = e^{j4\pi/3}$ |
| 2 | $W_{in,2} = e^{j2\pi/3}$ | $W_{out,2} = e^{j2\pi/3}$ |
| 3 | $W_{in,3} = e^{j4\pi/3}$ | $W_{out,3} = 1$ |

Table 10 shows the input and output coefficients for the amplification system 705 in FIG. 7 where $\alpha=\beta=2$.

TABLE 10

| Channel | $W_{in,n}$ | $W_{out,n}$ |
|---|---|---|
| 1 | $W_{in,1} = 1$ | $W_{out,1} = e^{j3\pi/2}$ |
| 2 | $W_{in,2} = e^{j\pi/2}$ | $W_{out,2} = e^{j\pi}$ |
| 3 | $W_{in,3} = e^{j\pi}$ | $W_{out,3} = e^{j\pi/2}$ |
| 4 | $W_{in,4} = e^{j3\pi/2}$ | $W_{out,4} = 1$ |

Table 11 shows the input and output coefficients for the amplification system 905 in FIG. 9 where $\alpha=\beta=2$.

TABLE 11

| Channel | $W_{in,n}$ | $W_{out,n}$ |
|---|---|---|
| 1 | $W_{in,1} = 1$ | $W_{out,1} = e^{j5\pi/3}$ |
| 2 | $W_{in,2} = e^{j\pi/3}$ | $W_{out,2} = e^{j4\pi/3}$ |
| 3 | $W_{in,3} = e^{j2\pi/3}$ | $W_{out,3} = e^{j\pi}$ |
| 4 | $W_{in,4} = e^{j\pi}$ | $W_{out,4} = e^{j2\pi/3}$ |
| 5 | $W_{in,5} = e^{j4\pi/3}$ | $W_{out,5} = e^{j\pi/3}$ |
| 6 | $W_{in,6} = e^{j5\pi/3}$ | $W_{out,6} = 1$ |

Table 12 shows the input and output coefficients for the amplification system 1005 in FIG. 10 where $\alpha=\beta=2$.

TABLE 12

| Channel | $W_{in,n}$ | $W_{out,n}$ |
|---|---|---|
| 1 | $W_{in,1} = 1$ | $W_{out,1} = e^{j7\pi/4}$ |
| 2 | $W_{in,2} = e^{j\pi/4}$ | $W_{out,2} = e^{j3\pi/2}$ |
| 3 | $W_{in,3} = e^{j\pi/2}$ | $W_{out,3} = e^{j5\pi/4}$ |
| 4 | $W_{in,4} = e^{j3\pi/4}$ | $W_{out,4} = e^{j\pi}$ |
| 5 | $W_{in,5} = e^{j\pi}$ | $W_{out,5} = e^{j3\pi/4}$ |
| 6 | $W_{in,6} = e^{j5\pi/4}$ | $W_{out,6} = e^{j\pi/2}$ |
| 7 | $W_{in,7} = e^{j3\pi/2}$ | $W_{out,7} = e^{j\pi/4}$ |
| 8 | $W_{in,8} = e^{j7\pi/4}$ | $W_{out,8} = 1$ |

Figure 12:
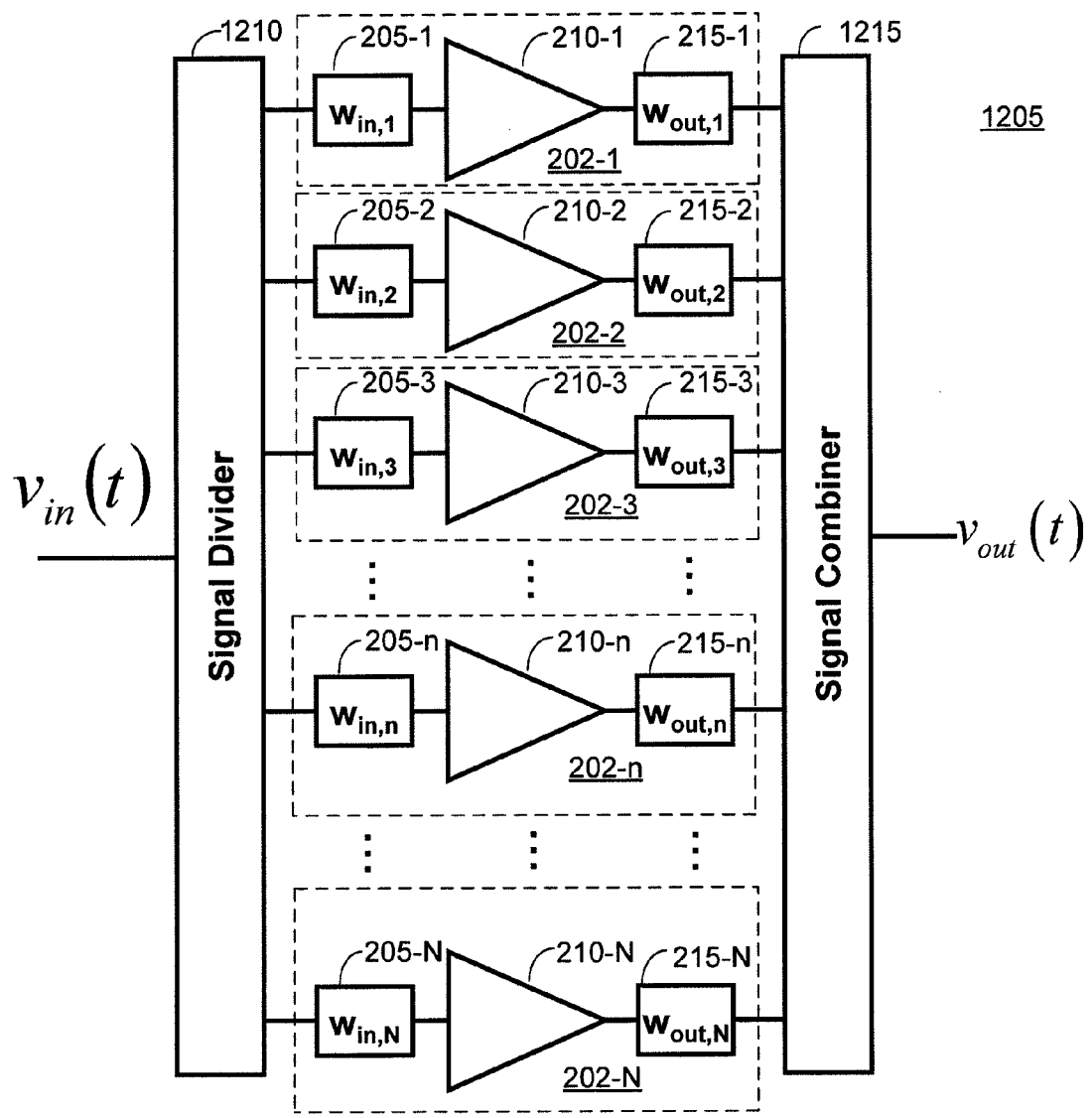
FIG. 12 is a diagram of an amplification system comprising a signal divider, N amplifying channels and a signal combiner according to an aspect of the disclosure.

FIG. 12 shows the amplification system including a signal divider 1210 and a signal combiner 1320 according to an aspect of the disclosure. The signal divider 1210 receives the input signal $v_{in}(t)$ to the amplification and divides the received input signal among the amplifying channels 202-1 to 202-N. In one aspect, the signal divider 1210 divides the input signal $v_{in}(t)$ into N identical input signals distributed evenly among the amplifying channels 202-1 to 202-N. The signal combiner 1215 combines the amplified output signals of the amplifying channels 202-1 to 202-N into the amplified output signal $v_{out}(t)$ of the amplification system. The signal combiner 1215 may be implemented using a low loss signal combiner or power combiner, for example, a Wilkinson power combiner.

Figure 13:
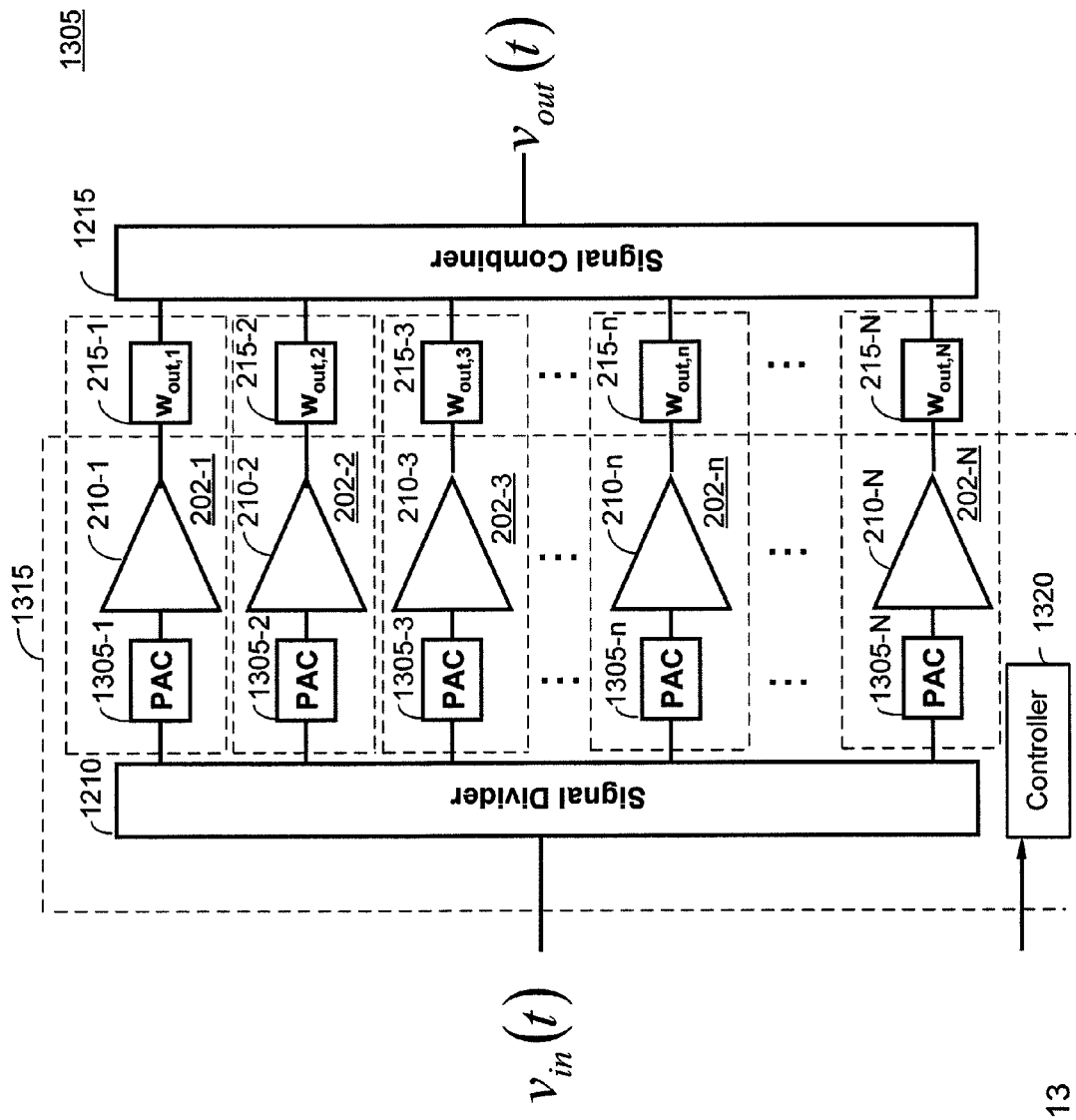
FIG. 13 is a diagram of an amplification system comprising N amplifying channels and a plurality phase and amplitude adjusters according to an aspect of the disclosure.

FIG. 13 shows an aspect of the amplification system 1305, in which the input coefficient units comprise a plurality of phase and amplitude adjuster circuits (PACs) 1305-1 to 1305-N. Each PAC 1305-1 to 1305-N is configured to adjust the phase and amplitude of the respective input signal. In this aspect, each PAC 1305-1 to 1305-N is configured to apply the input coefficient $w_{in,n}$ to the respective input signal. In addition, the PACs 1305-1 to 1305-N are configured to provide phase and amplitude adjustments of the input signals to compensate for differences in the operating characteristics of the amplifiers 210-1 to 210-N. This compensation enables the application system to approach an ideal case where the operating characteristics of the amplifiers 210-1 to 210-N are identical. The amplification system 1305 also comprises a controller 1320 for controlling the phase and amplitude adjustments by the PACs 1305-1 to 1305-N. The controller 1320 may control the phase and amplitude adjustments based on a lookup table stored in a memory, where the lookup table indicates the phase and amplitude adjustment to be applied to the input signal for each amplifiers. In this aspect, the operating characteristics of the amplifiers may be measured to determine the phase and amplitude adjustments needed to compensate for differences in their operating characteristics. The phase and amplitude adjustments by the PACs 1305-1 to 1305-N may be controlled by the controller 1320 or may be fixed, in which case the controller 1320 is not used.

To minimize differences in the amplifiers 210-1 to 210-N, the amplifiers 210-1 to 210-N may be integrated on an RF integrated circuit (RFIC) 1315 as shown in the example in FIG. 13. For example, the amplifiers 210-1 to 210-N can be integrated on the RFIC 1315 using a CMOS process, which allows other circuitry to also be integrated on the RFIC 1315. In the example in FIG. 13, the PACs 1305-1 to 1305-N, signal divider 1210 and controller 1420 are all integrated on the RFIC 1315. The amplifiers 210-1 to 210-N may also be implemented using discrete components.

Figure 14:
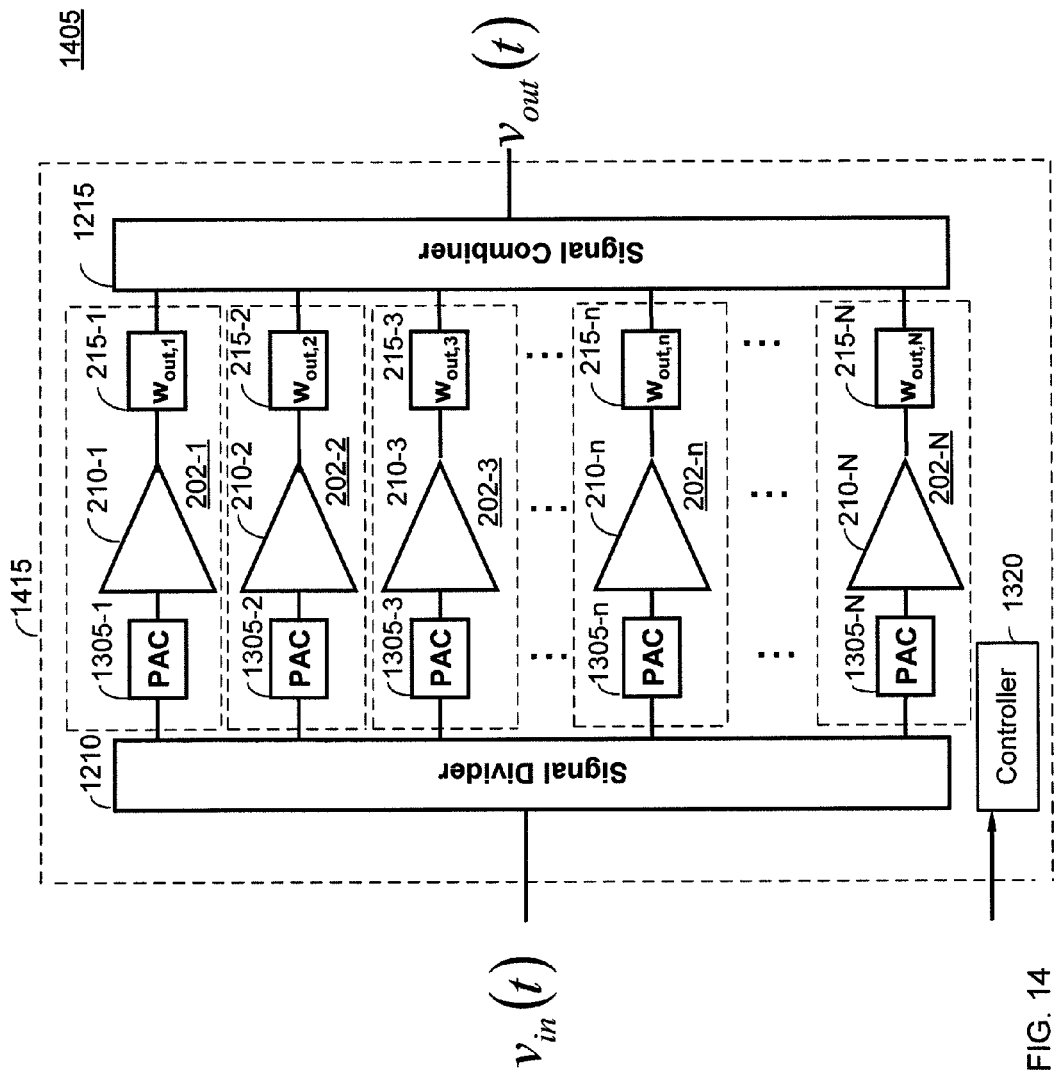
FIG. 14 is a diagram of an amplification system comprising N amplifying channels and a plurality phase and amplitude adjusters according to another aspect of the disclosure.

The output coefficient units 215-1 to 215-N may be implemented using transmission lines of different lengths that apply different phase delays to the amplified output signals of the amplifiers 210-1 to 210-N according to the output coefficients $w_{out,n}$. The amplified signals may then be combined in phase by the signal combiner 1215. In the example in FIG. 13, the output coefficient units 215-1 to 215-N and the signal combiner 1215 are external to the RFIC 1315. FIG. 14 shows an example where the output coefficients units 215-1 to 215-N and signal combiner 1215 are also integrated on the RFIC 1415.

The amplification systems 1305 and 1405 reduce cost and provide higher output power using an array of amplifiers 210-1 to 210-N. The array of amplifiers 210-1 to 210-N allows the amplification systems 1305 to 1405 to achieve higher output power using power amplifiers that individually have limited output power level (e.g., limited by the voltage level of the supply voltage to the amplifiers). The amplification systems 1305 and 1405 provide amplification with suppression of in-band intermodulation products and adjacent band intermodulation products or spectral regrowth. This enables each amplifier 210-1 to 210-N to be pushed further into operating in its non-linear regime to deliver higher efficiency while providing a spectrally clean signal amplification. The amplifiers 210-1 to 210-N may be implemented using Class AB, E or F amplifiers, Doherty amplifiers or other types of amplifiers.

Figure 15:
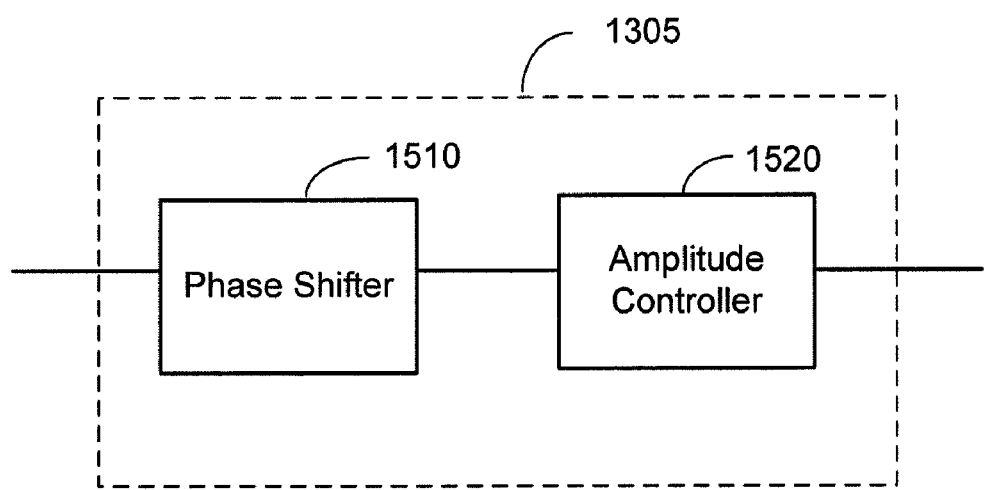
FIG. 15 is a diagram of a phase and amplitude adjuster according to an aspect of the disclosure.

FIG. 15 shows an example of a PAC 1305 according to an aspect of the disclosure. The PAC 1305 comprises a phase shifter 1510 and an amplitude controller 1520. The phase shifter 1510 may be implemented using an analog phase shifter and the amplitude controller 1520 may be implemented using a variable attenuator or variable gain amplifier. The phase shifter 1510 and amplitude controller 1520 may be controlled by the controller 1320 shown in FIGS. 13 and 14. Alternatively, the PAC 1305 may be implemented by dividing an input signal into In-phase (I) and Quadrature (Q) channels, using variable gain amplifiers to independently amplify the I and Q channels according to a desired phase and amplitude, and then summing the results as I and Q vectors.

The systems and methods according to aspects of the disclosure have been described using the example of suppressing intermodulation products due to non-linear power amplifiers. The systems and methods may be used to reduce the effects of non-linearity of all types of RF amplifiers including traveling wave tubes (TWTs) and other space charge devices. The systems and methods may also be used to reduce the non-linearity of optical amplifiers including erbium doped fiber amplifiers. The systems and methods according to aspects of the disclosure are generally applicable to other types of non-linear devices, including RF mixers, RF vector modulators, optical mixers, and acousto-optical modulators such as Bragg modulators, and electro-optical modulators such as Mach-Zehnder interferometers.

Figure 16:
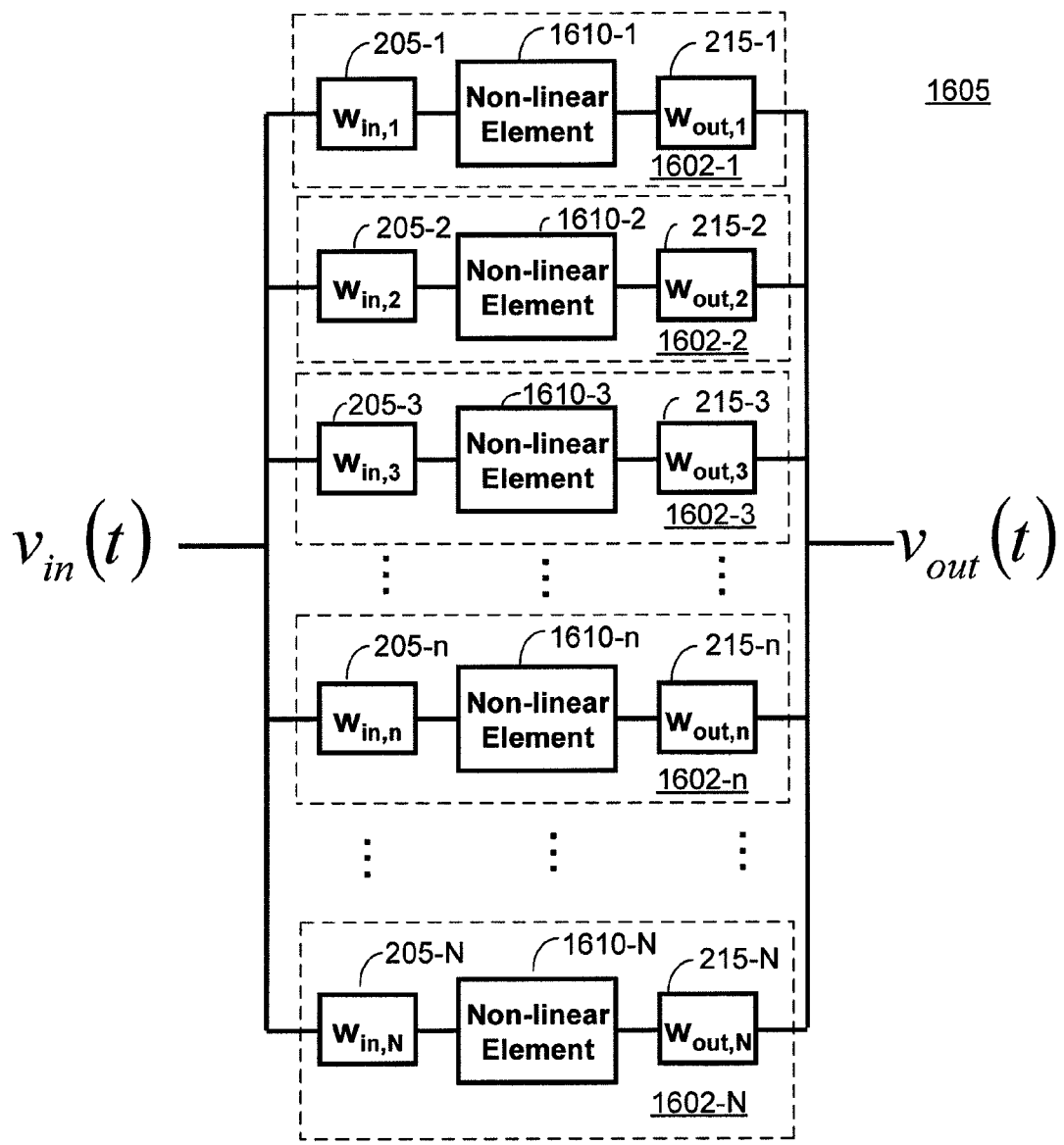
FIG. 16 is a diagram of a system comprising N non-linear elements with non-linear suppression according to an aspect of the disclosure.

FIG. 16 shows an example of system 1605 for suppressing the non-linearity of non-linear devices according to an aspect of disclosure. The system 1605 comprises a plurality of channels 1602-1 to 1602-N, where each channel comprises an input coefficient unit 205-1, a non-linear element 1610-1 to 1610-N, and an output coefficient unit 215-1 to 215-N. The non-linear elements 1610-N to 1610 may comprise any non-linear devices including any of the non-linear devices discussed above. The non-linear elements 1610-1 to 1610-N may have approximately the same operating characteristics. For example, the non-linear elements 1610-1 to 1610-N may be integrated on the same chip to provide good matching of the characteristics of the non-linear elements 1610-1 to 1610-N. Further, the input coefficient units 205-1 to 205-N may be implemented using PACs to provide phase and amplitude adjustments to compensate for differences in the non-linear elements 1610-1 to 1610-N so that the system 1605 approaches the case where the operating characteristics of the non-linear elements 1610-1 to 1610-N are identical.

The input and output coefficients $w_{in,n}$ and $w_{out,n}$, respectively, of the channels 1602-1 to 1602-N may be selected based on the type of non-linearity to be suppressed. For example, the first set of coefficients $c_k(N)$ may be used to suppress odd order non-linear products of the non-linear elements 1610-1 to 1610-N.

The system 1605 can be used to improve the spur free dynamic range of non-linear devices. Some non-linear devices produce more even order or odd order non-linear products. Thus, a selection from the first set or second set of coefficients may be made on a case-by-case basis. Also, other sets of coefficients may be used based on other values for the parameters $\alpha$ and $\beta$.

The description of the invention is provided to enable any person skilled in the art to practice the various embodiments described herein. While the present invention has been particularly described with reference to the various figures and embodiments, it should be understood that these are for illustration purposes only and should not be taken as limiting the scope of the invention.

There may be many other ways to implement the invention. Various functions and elements described herein may be partitioned differently from those shown without departing from the spirit and scope of the invention. Various modifications to these embodiments will be readily apparent to those skilled in the art, and generic principles defined herein may be applied to other embodiments. Thus, many changes and modifications may be made to the invention, by one having ordinary skill in the art, without departing from the spirit and scope of the invention.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. An amplification system, comprising:
   a plurality of amplifiers, wherein each of the amplifiers belongs to a same amplifier type and each of the amplifiers is configured to amplify a respective input signal into a respective amplified output signal;
   a plurality of input coefficient units configured to apply input coefficients to the input signals of the plurality of amplifiers, wherein each of the input coefficient units applies an input coefficient $w_{in,n}$ to the input signal of one of the plurality of amplifiers, the input coefficient $w_{in,n}$ given by $$w_{in,n} = e^{j\alpha(n-1)\pi/N}$$

where $\alpha$ is a first parameter, n is an integer from 1 to N where N is a number of the plurality of amplifiers and n is different for each of the input coefficient units;
   a plurality of output coefficient units configured to apply output coefficients to the amplified output signals of the plurality of amplifiers; and a signal combiner configured to combine the amplified output signals into a single amplified output signal, wherein the input and output coefficients applied to the input signals and the amplified output signals of the plurality of amplifiers suppress non-linear products when the amplified output signals are combined into the single amplified output signal.

2. The system of claim 1, wherein each of the output coefficient units applies an output coefficient $w_{out,n}$ to the amplified output signal of one of the plurality of amplifiers, the output coefficient $w_{out,n}$ given by $$w_{out,n} = e^{j\beta(N-n)\pi/N}$$

where $\beta$ is a second parameter.

3. The system of claim 2, wherein the first parameter $\alpha$ and the second parameter $\beta$ are both equal to one or are both equal to two.

4. The system of claim 1, wherein the amplifier type is class AB amplifier, class B amplifier, class C amplifier, class D amplifier, class E amplifier, class F amplifier, Doherty amplifier or push-pull amplifier.

5. The system of claim 1, wherein the plurality of input coefficient units comprises a plurality of phase and amplitude adjusters, each of the phase and amplitude adjusters configured to modify the input signal to one of the plurality of amplifiers to compensate for differences among the plurality of amplifiers.

6. The system of claim 1, wherein the plurality of input coefficients units are configured to provide a fixed phase and amplitude adjustment to the input signal of each one of the plurality of amplifiers to compensate for differences among the plurality of amplifiers.

7. The system of claim 1, further comprising a filter configured to filter the single amplified output signal to remove non-linear intermodulation products that are located outside a desired frequency band.

8. A method of amplification, comprising:
amplifying a plurality of input signals into a plurality of amplified output signals using a plurality of amplifiers belonging to a same amplifier type;
applying a plurality of input coefficients to the plurality of input signals, wherein each of the input coefficients is applied to one of the input signals and is given by $$w_{in,n} = e^{j\alpha(n-1)\pi/N}$$

where $w_{in,n}$ is the input coefficient, $\alpha$ is a first parameter, n is an integer from 1 to N where N is a number of the plurality of amplifiers and n is different for each of the input coefficients;
applying a plurality of output coefficients to the plurality of amplified output signals; and
after applying the output coefficients to the plurality of amplified output signals, combining the plurality of amplified output signals into a single amplified output signal, wherein
the input and output coefficients applied to the input signals and the amplified output signals suppress non-linear products when the amplified output signals are combined into the single amplified output signal.

9. The method of claim 8, wherein each of the output coefficients is applied to one of the amplified output signals and is given by $$w_{out,n} = e^{j\beta(N-n)\pi/N}$$

where $w_{out,n}$ is the output coefficient and $\beta$ is a second parameter.

10. The method of claim 9, wherein the first parameter $\alpha$ and the second parameter $\beta$ are both equal to one or are both equal to two.

11. The method of claim 8, wherein the amplifier type is class AB amplifier, class B amplifier, class C amplifier, class D amplifier, class E amplifier, class F amplifier, Doherty amplifier or push-pull amplifier.

12. The method of claim 8, applying further comprising applying a phase and amplitude adjustment to each of the plurality of input signals to compensate for differences among the plurality of amplifiers.

13. The method of claim 12, wherein the phase and amplitude adjustment to each of the plurality of input signals is fixed.

14. The method of claim 9, further comprising filtering the single amplified output signal to remove non-linear intermodulation products that are located outside a desired frequency band.

15. A system, comprising:
a plurality of non-linear elements, wherein the non-linear elements have approximately the same operating characteristics and each of the non-linear elements is configured to process a respective input signal into a respective output signal;
a plurality of input coefficient units configured to apply input coefficients to the input signals of the plurality of non-linear elements, wherein each of the input coefficient units applies an input coefficient $w_{in,n}$ to the input signal of one of the plurality of amplifiers, the input coefficient $w_{in,n}$ given by $$w_{in,n} = e^{j\alpha(n-1)\pi/N}$$

where $\alpha$ is a first parameter, n is an integer from 1 to N where N is a number of the plurality of non-linear elements and n is different for each of the input coefficient units;
a plurality of output coefficient units configured to apply output coefficients to the output signals of the plurality of non-linear elements; and
a signal combiner configured to combine the output signals into a single output signal, wherein
the input and output coefficients applied to the input signals and the output signals of the plurality of non-linear elements suppress non-linear products when the output signals are combined into the single output signal.

16. The system of claim 15, wherein each of the output coefficient units applies an output coefficient $w_{out,n}$ to the output signal of one of the plurality of non-linear elements, the output $w_{out,n}$ given by $$w_{out,n} = e^{j\beta(N-n)\pi/N}$$

where $\beta$ is a second parameter.

17. The system of claim 16, wherein the first parameter $\alpha$ and the second parameter $\beta$ are both equal to one or are both equal to two.

18. The system of claim 15, wherein the plurality of non-linear elements comprises amplifiers, mixers or modulators.

19. The system of claim 15, wherein the plurality of input coefficient units comprises a plurality of phase and amplitude adjusters, each of the phase and amplitude adjusters configured to modify the input signal to one of the plurality of non-linear elements to compensate for differences among the plurality of none-linear.

* * * * *